US012772816B2

(12) United States Patent
Zhang et al.

(10) Patent No.: US 12,772,816 B2
(45) Date of Patent: Oct. 20, 2026

(54) SELF-ALIGNED BACKSIDE CONTACT IN NANOSHEET WITHOUT BDI

(71) Applicant: INTERNATIONAL BUSINESS MACHINES CORPORATION, Armonk, NY (US)

(72) Inventors: Chen Zhang, Guilderland, NY (US); Ruilong Xie, Niskayuna, NY (US); Julien Frougier, Albany, NY (US); Heng Wu, Santa Clara, CA (US); Min Gyu Sung, Latham, NY (US)

(73) Assignee: International Business Machines Corporation, Armonk, NY (US)

( * ) Notice: Subject to any disclaimer, the term of this patent is extended or adjusted under 35 U.S.C. 154(b) by 519 days.

(21) Appl. No.: 17/945,418

(22) Filed: Sep. 15, 2022

(65) Prior Publication Data

US 2024/0096699 A1 Mar. 21, 2024

(51) Int. Cl.

*H10W 20/00* (2026.01)
*H10D 84/01* (2025.01)
*H10D 84/03* (2025.01)
*H10W 20/41* (2026.01)

(52) U.S. Cl.

CPC ...... *H10W 20/069* (2026.01); *H10D 84/0149* (2025.01); *H10D 84/0158* (2025.01); *H10D 84/038* (2025.01); *H10W 20/0698* (2026.01); *H10W 20/427* (2026.01)

(58) Field of Classification Search

CPC ........................... H10D 62/121; H10D 30/019
See application file for complete search history.

(56) References Cited

U.S. PATENT DOCUMENTS

| | | | |
|---|---|---|---|
| 9,570,395 | B1 | 2/2017 | Sengupta et al. |
| 10,586,765 | B2 | 3/2020 | Smith et al. |
| 10,636,739 | B2 | 4/2020 | Beyne et al. |
| 10,700,207 | B2 | 6/2020 | Chen et al. |
| 10,797,139 | B2 | 10/2020 | Morrow et al. |
| 11,081,559 | B1 | 8/2021 | Liang et al. |
| 2018/0218973 | A1 | 8/2018 | Nelson et al. |
| 2020/0105671 | A1 | 4/2020 | Lai et al. |
| 2020/0266169 | A1 | 8/2020 | Kang et al. |
| 2020/0294998 | A1 | 9/2020 | Lilak et al. |
| 2021/0030538 | A1 | 2/2021 | Rajagopal et al. |

(Continued)

OTHER PUBLICATIONS

Gong et al., "A Privacy-Preserving-Oriented DNN Pruning and Mobile Acceleration Framework", Conference: GLSVLSI '20: Great Lakes Symposium on VLSI 2020, Sep. 2020, 6 pages, doi: 10.1145/3386263.3407650.

(Continued)

*Primary Examiner* — Mark V Prenty
(74) *Attorney, Agent, or Firm* — Harrity & Harrity, LLP

(57) ABSTRACT

A semiconductor structure is presented including a backside contact of a nanosheet transistor positioned on a silicon (Si) layer of a wafer and a dielectric liner disposed between the backside contact and the Si layer such that the dielectric liner is located below via spacers of the nanosheet transistor. The backside contact is closer to a backside of the wafer than a frontside of the wafer. The dielectric liner is vertically aligned with the gate spacers and the dielectric liner is vertically aligned with inner spacers of a nanosheet stack of the nanosheet transistor.

20 Claims, 13 Drawing Sheets

(56) References Cited

U.S. PATENT DOCUMENTS

| | | | | |
|---|---|---|---|---|
| 2021/0111115 | A1 | 4/2021 | Morrow et al. | |
| 2021/0202472 | A1 | 7/2021 | Thomson et al. | |
| 2021/0305381 | A1 | 9/2021 | Chiang et al. | |
| 2021/0305428 | A1 | 9/2021 | Ju et al. | |
| 2022/0069117 | A1* | 3/2022 | Yu | H10D 30/024 |
| 2022/0115510 | A1 | 4/2022 | Yu et al. | |

OTHER PUBLICATIONS

Mathur et al., "Buried Bitline for sub-5nm SRAM Design", 2020 IEEE International Electron Devices Meeting (IEDM), Dec. 2020, 04 pages.

Prasad et al., "Buried Power Rails and Back-side Power Grids: Arm® CPU Power Delivery Network Design Beyond 5nm", 2019 IEEE International Electron Devices Meeting (IEDM), Dec. 2019, 04 pages.

* cited by examiner

SELF-ALIGNED BACKSIDE CONTACT IN NANOSHEET WITHOUT BDI

BACKGROUND

The present invention relates generally to semiconductor devices, and more specifically, to constructing a self-aligned backside contact in a nanosheet structure without a bottom dielectric isolation (BDI) layer.

Semiconductor devices are used in a variety of electronic applications, such as personal computers, cell phones, digital cameras, and other electronic equipment. Semiconductor devices are usually fabricated by sequentially depositing insulating or dielectric layers, conductive layers, and semiconductive layers of material over a semiconductor substrate, and patterning the various material layers using lithography to form circuit components and elements thereon.

The semiconductor industry has experienced rapid growth due to improvements in the integration density of a variety of electronic components (e.g., transistors, diodes, resistors, capacitors, etc.). For the most part, this improvement in integration density has come from shrinking the semiconductor process node. With the increased demands for miniaturization, higher speed, greater bandwidth, lower power consumption, and lower latency, chip layout has become more complicated and difficult to achieve in the production of semiconductor dies.

Fin-based active devices, primarily transistors, are extensively applied for the production of standard cells and other active device configurations processed in the front-end-of-line (FEOL) part of the integrated circuit fabrication process, and include FinFETs, as well as more recent devices based on nanowires or nanosheets. An example technology involves the use of buried interconnect rails in the FEOL. Buried power rails (BPRs) can directly connect the transistors in the FEOL to a power delivery network located entirely on the back side of an integrated circuit chip. In particular, the source or drain area of a number of transistors are directly connected to a buried rail. The current practice for realizing this configuration is to produce an interconnect via to the buried rail, and to couple the interconnect via to the source or drain area through a local interconnect that is part of the source/drain contact level of the chip, also referred to as the "middle end of line," which is a transition between the active devices in the FEOL, and the interconnect levels (M1, M2, etc.) in the back-end-of-line (BEOL).

Some implementations of this approach have a number of drawbacks. As the rails are buried underneath the active devices, the size of the buried power rail (BPR) is limited by the cell-to-cell space between two nearby active regions. As cell height scales down, so does the cell-to-cell space, the buried power rail size decreases, and its resistance increases, which degrades the circuit performance.

To achieve better performance, contact optimization over the source/drain (S/D) epitaxy is needed, especially for FinFET technology and other technologies beyond FinFET, such as nanosheet, where the S/D epi can be tall, and a wrap around contact which contacts not only the top and also the sidewall surfaces of the S/D epi is needed to maximize the contact area and reduce the contact resistance. Contact resistance is a contributor of the total resistance of a transistor as transistor device scaling continues beyond (e.g., below) the 10 nanometer (nm) technology node. The term "contact resistance" is a measure of the ease with which current can flow across a metal-semiconductor interface. Contact resistivity (RhoC) reduction alone is not enough to reduce external resistance to its target for 10 nm technology node and beyond, and a new contact structure is needed to increase the contact area. Backside contacts can be considered an ideal contact structure. However, backside contacts with a bottom dielectric isolation layer are known to cause issues in certain semiconductor manufacturing processes.

SUMMARY

In accordance with an embodiment, a semiconductor structure is provided. The semiconductor structure includes a backside contact of a nanosheet transistor positioned on a silicon (Si) layer of a wafer and a dielectric liner disposed between the backside contact and the Si layer such that the dielectric liner is located below via spacers of the nanosheet transistor.

In accordance with another embodiment, a semiconductor structure is provided. The semiconductor structure includes a backside contact of a nanosheet transistor extending to a top surface of a source/drain (S/D) epi region and a dielectric liner disposed directly between and in direct contact with the backside contact.

In accordance with yet another embodiment, a method for forming a semiconductor structure is provided. The method includes positioning a backside contact of a nanosheet transistor on a silicon (Si) layer of a wafer and disposing a dielectric liner between the backside contact and the Si layer such that the dielectric liner is located below via spacers of the nanosheet transistor.

In one preferred aspect, the backside contact is closer to a backside of the wafer than a frontside of the wafer.

In another preferred aspect, the backside contact directly contacts a top surface of a source/drain (S/D) epi region.

In yet another preferred aspect, the dielectric liner directly contacts the S/D epi region.

In one preferred aspect, the dielectric liner has a generally C-shaped configuration.

In another preferred aspect, the dielectric liner is vertically aligned with the via spacers.

In yet another preferred aspect, the dielectric liner is vertically aligned with inner spacers of a nanosheet stack of the nanosheet transistor.

In another preferred aspect, the dielectric liner is thinner than the via spacers.

In another preferred aspect, the via spacers and the dielectric liner collectively encompass the backside contact.

The advantages of the present invention include producing transistors that consume less power, have better performance, occupy less area on a wafer, and reduce cost in semiconductor manufacturing. The advantages of the present invention further include improving the backside contact for backside power rail and backside power delivery network technology by removing the bottom dielectric isolation (BDI) layer and instead employing a dielectric liner. The dielectric liner is disposed between the backside contact and a Si layer such that the dielectric liner is advantageously located below via spacers of the nanosheet transistor. This dielectric liner advantageously eliminates the need for a BDI layer and advantageously prevents sub-nanosheet leakage current. The backside contact is advantageously closer to a backside of the wafer than a frontside of the wafer.

It should be noted that the exemplary embodiments are described with reference to different subject-matters. In particular, some embodiments are described with reference to method type claims whereas other embodiments have been described with reference to apparatus type claims. However, a person skilled in the art will gather from the above and the following description that, unless otherwise notified, in addition to any combination of features belonging to one type of subject-matter, also any combination between features relating to different subject-matters, in particular, between features of the method type claims, and features of the apparatus type claims, is considered as to be described within this document.

These and other features and advantages will become apparent from the following detailed description of illustrative embodiments thereof, which is to be read in connection with the accompanying drawings.

BRIEF DESCRIPTION OF THE DRAWINGS

The invention will provide details in the following description of preferred embodiments with reference to the following figures wherein.

Throughout the drawings, same or similar reference numerals represent the same or similar elements.

DETAILED DESCRIPTION

Embodiments in accordance with the present invention provide methods and devices for constructing a self-aligned backside contact in a nanosheet structure without a bottom dielectric isolation (BDI) layer. A dielectric liner is advantageously disposed between the backside contact and a Si layer such that the dielectric liner is advantageously located below via spacers of the nanosheet transistor. This dielectric liner eliminates the need for a BDI layer and advantageously prevents sub-nanosheet leakage current. The backside contact is advantageously closer to a backside of the wafer than a frontside of the wafer.

Examples of semiconductor materials that can be used in forming such nanosheet structures include silicon (Si), germanium (Ge), silicon germanium alloys (SiGe), silicon carbide (SiC), silicon germanium carbide (SiGeC), III-V compound semiconductors and/or II-VI compound semiconductors. III-V compound semiconductors are materials that include at least one element from Group III of the Periodic Table of Elements and at least one element from Group V of the Periodic Table of Elements. II-VI compound semiconductors are materials that include at least one element from Group II of the Periodic Table of Elements and at least one element from Group VI of the Periodic Table of Elements.

It is to be understood that the present invention will be described in terms of a given illustrative architecture; however, other architectures, structures, substrate materials and process features and steps/blocks can be varied within the scope of the present invention. It should be noted that certain features cannot be shown in all figures for the sake of clarity. This is not intended to be interpreted as a limitation of any particular embodiment, or illustration, or scope of the claims.

Figure 1:
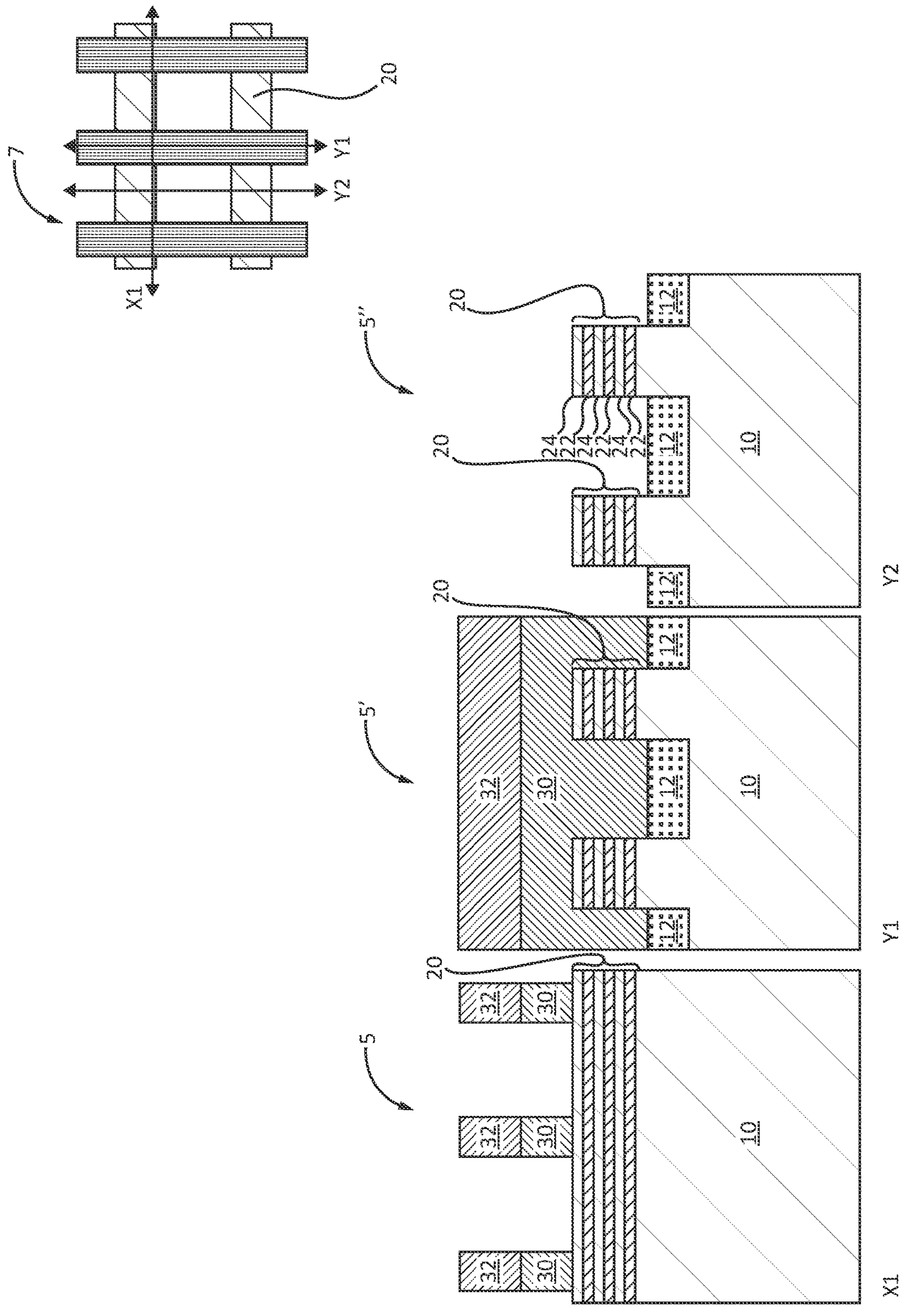
FIG. 1 is a cross-sectional view of a semiconductor structure including nanosheet stacks formed over a substrate, where a sacrificial layer with a hardmask are also formed over the nanosheet stacks, in accordance with an embodiment of the present invention.

FIG. 1 is a cross-sectional view of a semiconductor structure including nanosheet stacks formed over a substrate, where a sacrificial layer with a hardmask are also formed over the nanosheet stacks, in accordance with an embodiment of the present invention.

In various example embodiments, a structure 5 in the X1-cut direction includes a nanosheet stack 20 formed over a substrate 10. The nanosheet stack 20 includes alternating layers of a first semiconductor material (or layer) 22 and a second semiconductor material (or layer) 24. The first semiconductor material 22 can be, e.g., silicon germanium (SiGe) and the second semiconductor material 24 can be, e.g., silicon (Si). Then a sacrificial layer 30 with a hardmask 32 are also formed over the nanosheet stack 20.

The top view 7 illustrates the nanosheet stacks 20 in relation to the gates.

In the Y1-cut direction, the structure 5' depicts the sacrificial layer 30 with the hardmask 32 over the nanosheet stacks 20.

In the Y2-cut direction, the structure 5" depicts the nanosheet stacks, as well as shallow trench isolation (STI) regions 12 formed over the substrate 10.

In one or more embodiments, the substrate 10 can be a semiconductor or an insulator with an active surface semiconductor layer. The substrate 10 can be crystalline, semicrystalline, microcrystalline, or amorphous. The substrate 10 can be essentially (e.g., except for contaminants) a single element (e.g., silicon), primarily (e.g., with doping) of a single element, for example, silicon (Si) or germanium (Ge), or the substrate 10 can include a compound, for example, $Al_2O_3$, $SiO_2$, GaAs, SiC, or SiGe. The substrate 10 can also have multiple material layers, for example, a semiconductor-on-insulator substrate (SeOI), a silicon-on-insulator substrate (SOI), germanium-on-insulator substrate (GeOI), or silicon-germanium-on-insulator substrate (SGOI). The substrate 10 can also have other layers forming the substrate 10, including high-k oxides and/or nitrides. In one or more embodiments, the substrate 10 can be a silicon wafer. In an embodiment, the substrate 10 is a single crystal silicon wafer.

Referring to, e.g., the nanosheet stack 20, the first semiconductor material 22 can be the first layer in a stack of sheets of alternating materials. The nanosheet stack 20 thus includes first semiconductor materials (or layers) 22 and second semiconductor materials (or layers) 24. Although it is specifically contemplated that the first semiconductor materials 22 can be formed from silicon germanium and that the second semiconductor materials 24 can be formed from silicon, it should be understood that any appropriate materials can be used instead, as long as the two semiconductor materials have etch selectivity with respect to one another. As used herein, the term "selective" in reference to a material removal process denotes that the rate of material removal for a first material is greater than the rate of removal for at least another material of the structure to which the material removal process is being applied. The alternating semiconductor materials 22/24 can be deposited by any appropriate mechanism. It is specifically contemplated that the first and second semiconductor materials 22/24 can be epitaxially grown from one another, but alternate deposition processes, such as chemical vapor deposition (CVD), physical vapor deposition (PVD), atomic layer deposition (ALD), or gas cluster ion beam (GCIB) deposition, are also contemplated.

In various embodiments, the sacrificial layer 30 and the hardmask 32 can be a nitride, for example, a silicon nitride (SiN), an oxynitride, for example, silicon oxynitride (SiON), or a combination thereof.

Regarding various dielectrics or dielectric layers (such as the sacrificial layer 30 and the hardmask 32) discussed herein, the dielectrics can include, but are not limited to, SiN, SiOCN, SiOC, SiBCN, $SO_2$, or ultra-low-k (ULK) materials, such as, for example, porous silicates, carbon doped oxides, silicon dioxides, silicon nitrides, silicon oxynitrides, carbon-doped silicon oxide (SiCOH) and porous variants thereof, silsesquioxanes, siloxanes, or other dielectric materials having, for example, a dielectric constant in the range of about 2 to about 10.

In some embodiments, the dielectrics can be conformally deposited using atomic layer deposition (ALD) or, chemical vapor deposition (CVD). Variations of CVD processes suitable for forming the dielectrics include, but are not limited to, Atmospheric Pressure CVD (APCVD), Low Pressure CVD (LPCVD) and Plasma Enhanced CVD (PECVD), Metal-Organic CVD (MOCVD) and combinations thereof can also be employed.

Figure 2:
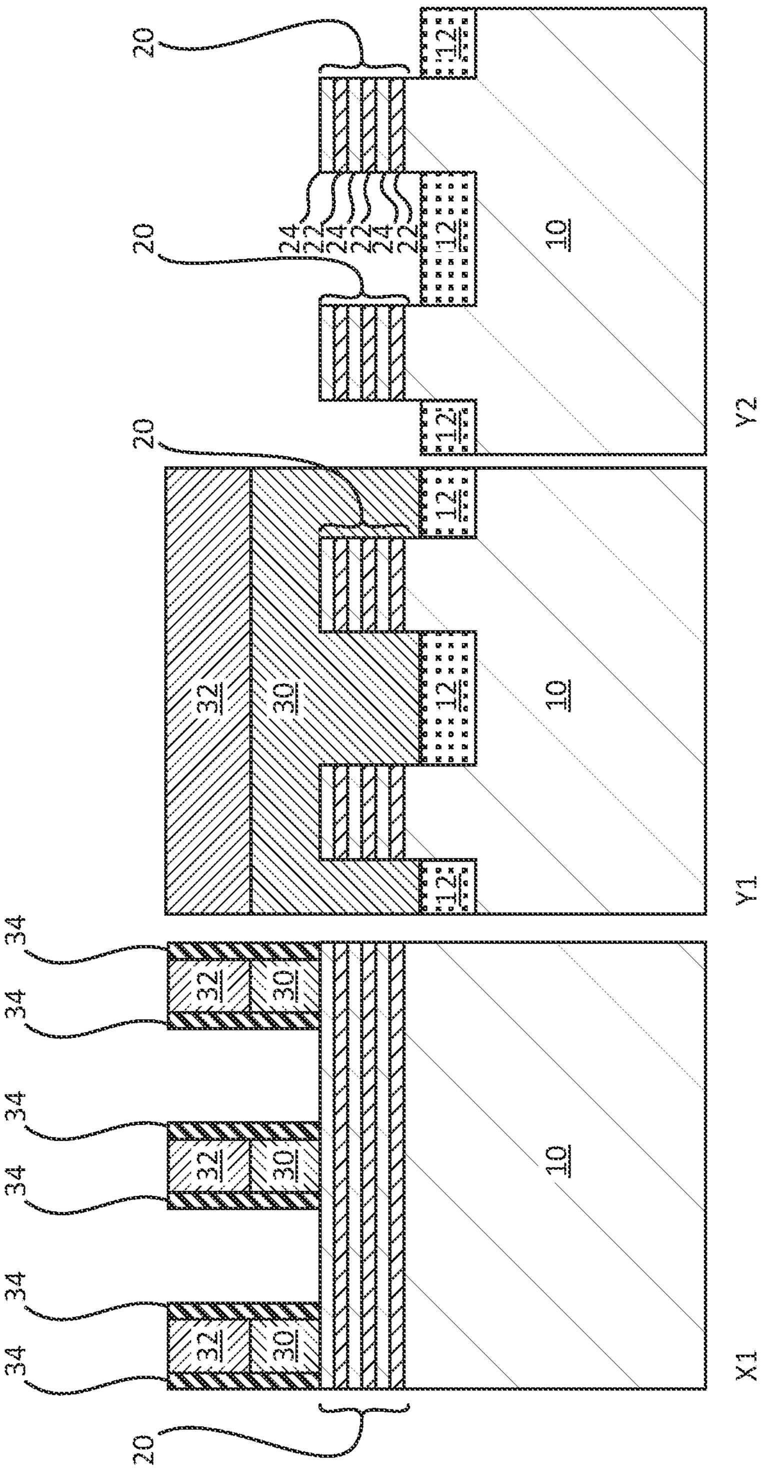
FIG. 2 is a cross-sectional view of the semiconductor structure of FIG. 1 where spacers are formed adjacent the sacrificial layer with the hardmask, in accordance with an embodiment of the present invention.

FIG. 2 is a cross-sectional view of the semiconductor structure of FIG. 1 where spacers are formed adjacent the sacrificial layer with the hardmask, in accordance with an embodiment of the present invention.

In various example embodiments, spacers 34 are formed adjacent the sacrificial layer 30 with the hardmask 32, as shown in the X1-cut direction.

The spacers 34 can include any of one or more of SiN, SiBN, SiCN and/or SiBCN films.

Figure 3:
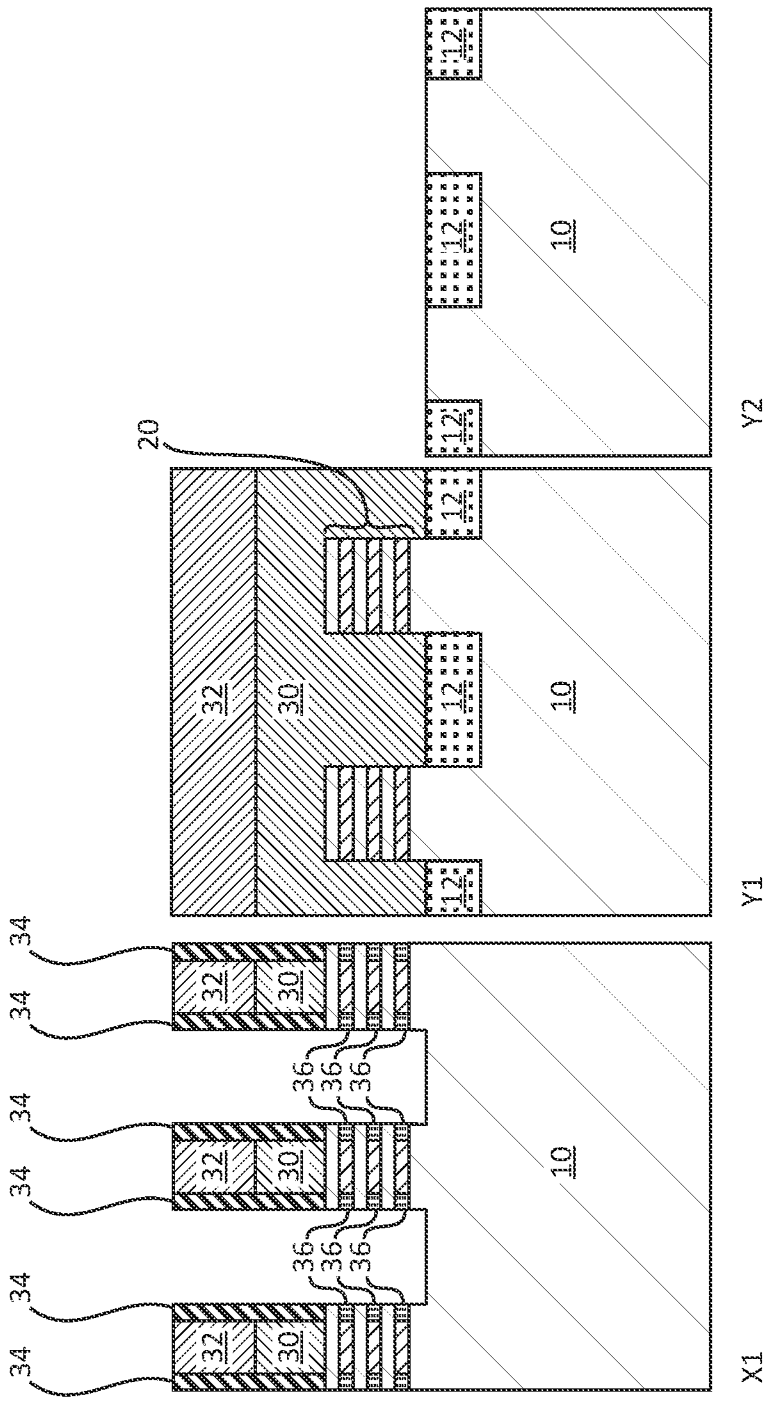
FIG. 3 is a cross-sectional view of the semiconductor structure of FIG. 2 where the nanosheet stacks are patterned and inner spacers are formed, in accordance with an embodiment of the present invention.

FIG. 3 is a cross-sectional view of the semiconductor structure of FIG. 2 where the nanosheet stacks are patterned and inner spacers are formed, in accordance with an embodiment of the present invention.

In various example embodiments, the nanosheet stacks 20 are patterned and inner spacers 36 are formed.

The inner spacers 36 can include any of one or more of SiN, SiBN, SiCN and/or SiBCN films.

Figure 4:
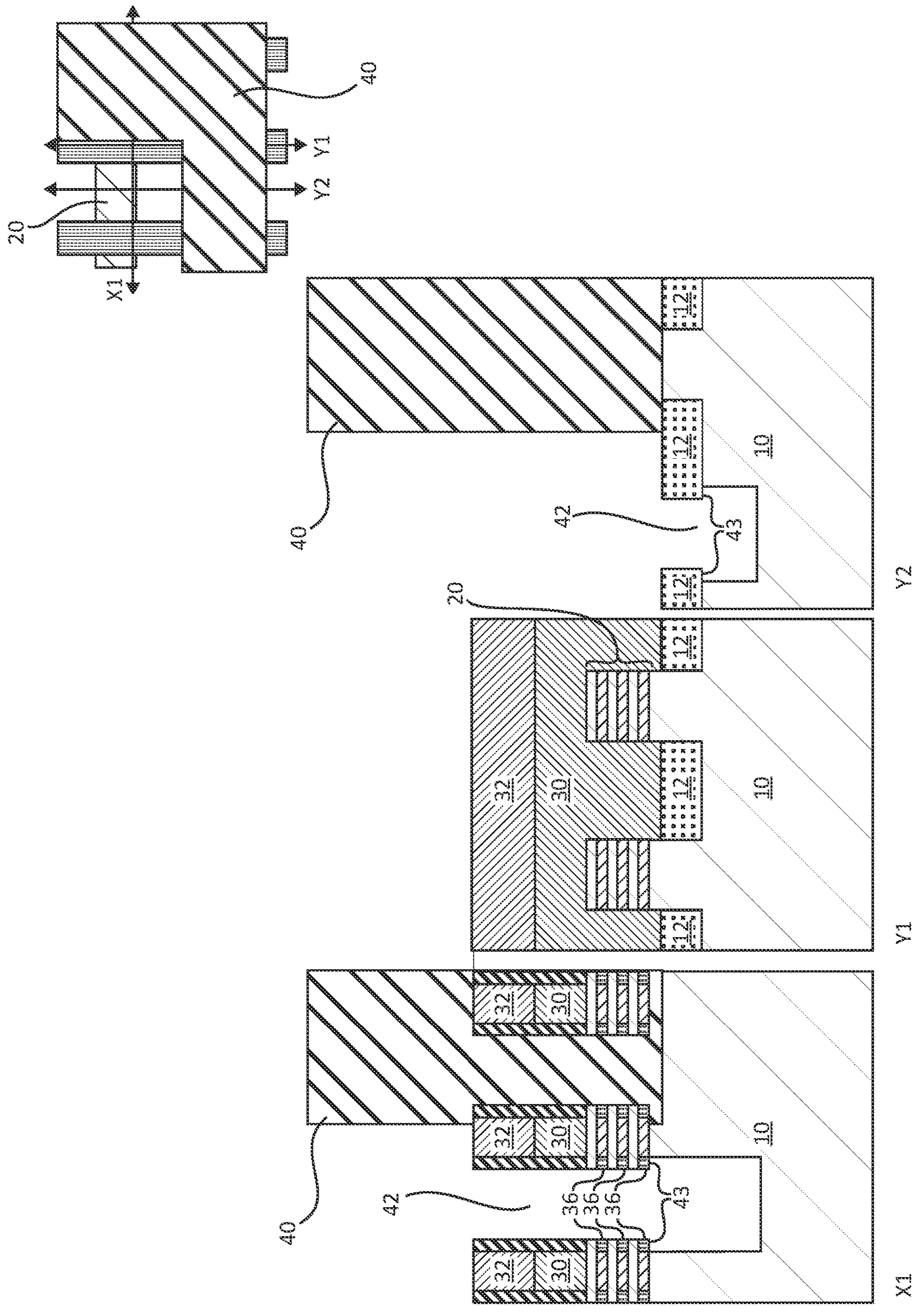
FIG. 4 is a cross-sectional view of the semiconductor structure of FIG. 3 where an organic planarization layer (OPL) is deposited and a lateral etch is performed to define an opening with an overhang, in accordance with an embodiment of the present invention.

FIG. 4 is a cross-sectional view of the semiconductor structure of FIG. 3 where an organic planarization layer (OPL) is deposited and a lateral etch is performed to define an opening with an overhang, in accordance with an embodiment of the present invention.

In various example embodiments, an organic planarization layer (OPL) 40 is deposited and a lateral etch is advantageously performed to define an opening 42 with an overhang 43. The overhang 43 is an area directly underneath the inner spacers 36. Thus, the overhang 43 is advantageously vertically aligned with the inner spacers 36 and also vertically aligned with the spacers 34.

The OPL 40 can include an organic material, such as a polymer. The thickness of the OPL 40 can be in a range from about 10 nm to about 300 nm. In one example, the thickness of the OPL 40 is about 100 nm-150 nm.

The etching can include a dry etching process such as, for example, reactive ion etching, plasma etching, ion etching or laser ablation. The etching can further include a wet chemical etching process in which one or more chemical etchants are used to remove portions of the blanket layers that are not protected by the patterned photoresist.

The dry and wet etching processes can have etching parameters that can be tuned, such as etchants used, etching temperature, etching solution concentration, etching pressure, source power, RF bias voltage, RF bias power, etchant flow rate, and other suitable parameters. Dry etching processes can include a biased plasma etching process that uses a chlorine-based chemistry. Other dry etchant gasses can include Tetrafluoromethane ($CF_4$), nitrogen trifluoride ($NF_3$), sulfur hexafluoride ($SF_6$), and helium (He), and Chlorine trifluoride ($ClF_3$). Dry etching can also be performed anisotropically using such mechanisms as DRIE (deep reactive-ion etching). Chemical vapor etching can be used as a selective etching method, and the etching gas can include hydrogen chloride (HCl), Tetrafluoromethane ($CF_4$), and gas mixture with hydrogen ($H_2$). Chemical vapor etching can be performed by CVD with suitable pressure and temperature.

Figure 5:
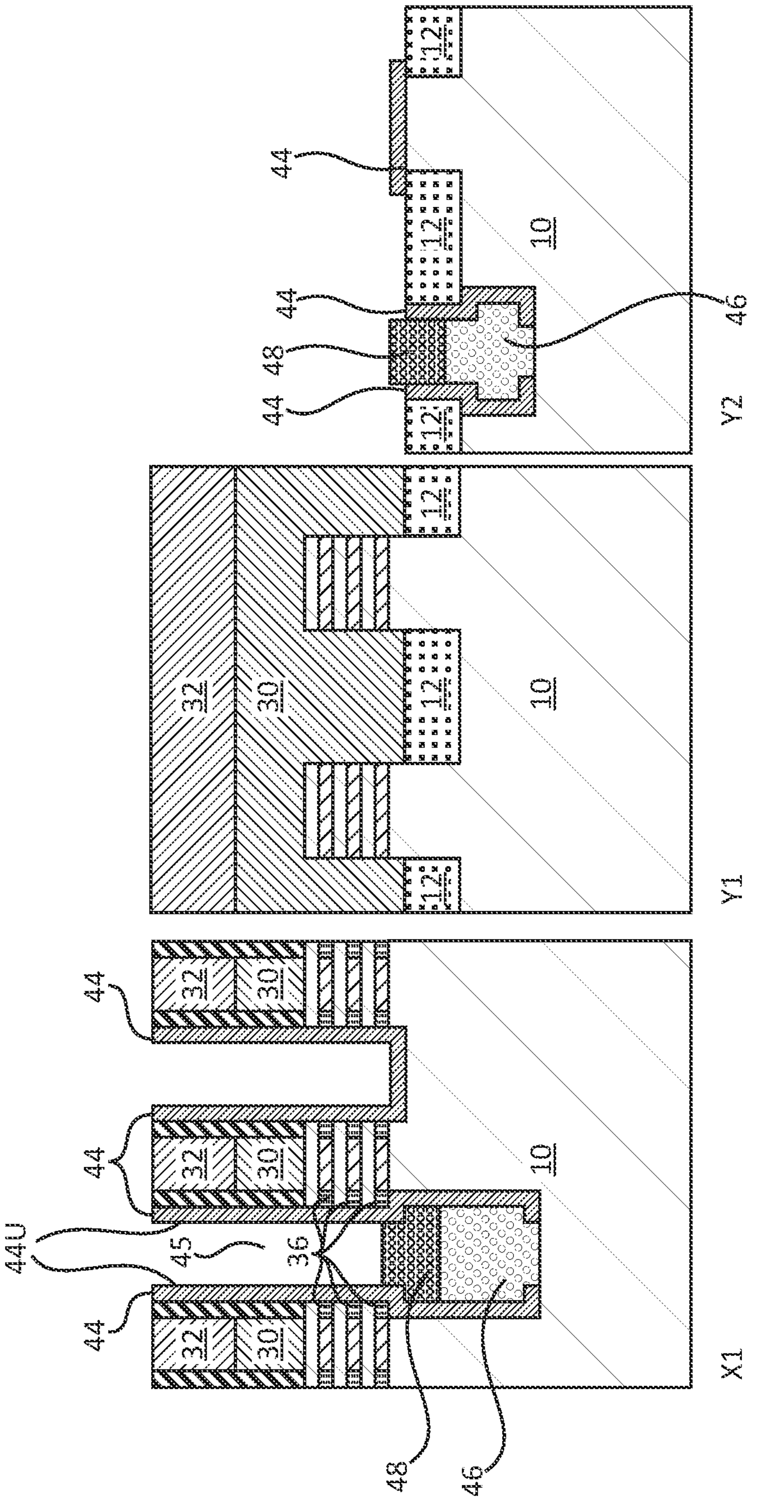
FIG. 5 is a cross-sectional view of the semiconductor structure of FIG. 4 where a dielectric liner is deposited and a silicon germanium (SiGe) layer with a low concentration of germanium (Ge) and a silicon (Si) cap layer are formed within the dielectric liner and the opening with the overhang, in accordance with an embodiment of the present invention.

FIG. 5 is a cross-sectional view of the semiconductor structure of FIG. 4 where a dielectric liner is deposited and a silicon germanium (SiGe) layer with a low concentration of germanium (Ge) and a silicon (Si) cap layer are formed within the dielectric liner and the opening with the overhang, in accordance with an embodiment of the present invention.

In various example embodiments, a dielectric liner 44 is deposited and a silicon germanium (SiGe) layer 46 with a low concentration of germanium (Ge) and a silicon (Si) cap layer 48 are formed within the dielectric liner 44 and the opening with the overhang 43.

The dielectric liner 44 advantageously extends in the overhang region directly underneath the inner spacers 36. In other words, a portion of the dielectric liner 44 is vertical aligned with the inner spacers 36 within the lateral etch back region and a portion of the dielectric liner 44 directly contacts sidewalls of the inner spacers 36 within area 45. In area 45, the dielectric liner 44 is substantially or generally linear (upper dielectric liner 44U), whereas in the lateral etch back region or overhang region, the dielectric liner 44 advantageously defines a C-shaped and inverse C-shaped configurations (lower dielectric liner 44L).

The SiGe layer 46 rests within the lateral etch back region or overhang region, whereas the Si cap layer 48 rests within both area 45 and the lateral etch back region or overhang region. A top surface of the Si cap layer 48 can be collinear with a top surface of the lowermost inner spacer 36.

The dielectric liner 44 can include any dielectric material as noted above.

Figure 6:
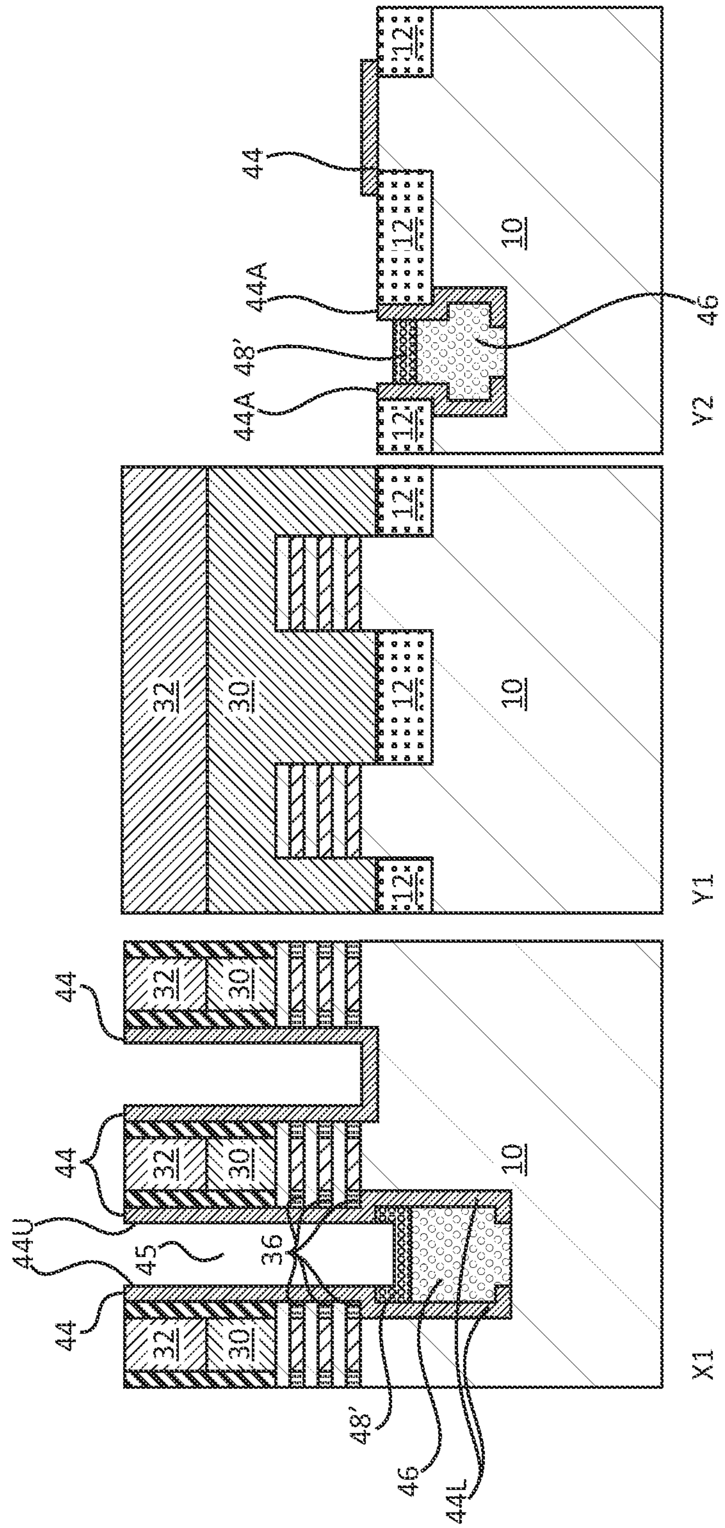
FIG. 6 is a cross-sectional view of the semiconductor structure of FIG. 5 where the Si cap layer is etched back to form Si cap layer portions, in accordance with an embodiment of the present invention.

FIG. 6 is a cross-sectional view of the semiconductor structure of FIG. 5 where the Si cap layer is etched back to form Si cap layer portions, in accordance with an embodiment of the present invention.

In various example embodiments, the Si cap layer 48 is etched back to form Si cap layer portion 48'. In the X1-cut direction, the Si cap layer portion 48' remains below area 45 defined between the upper dielectric liners 44U. The Si cap layer portion 48' remains within the lower dielectric liners 44L. The Si cap layer portion 48' remains below a bottom surface of the lowermost inner spacer 36. In the Y2-cut direction, dielectric liner portions 44A extend above a top surface of the Si cap layer portion 48'.

Figure 7:
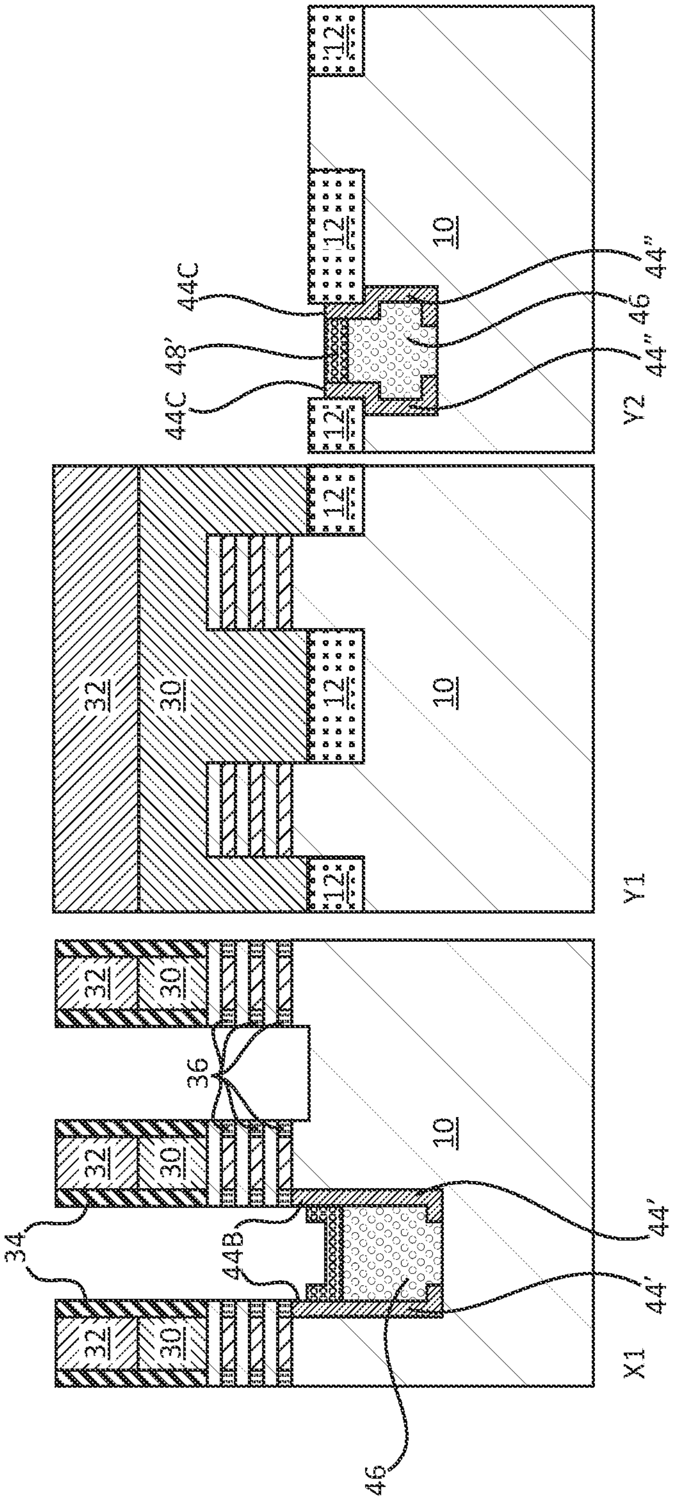
FIG. 7 is a cross-sectional view of the semiconductor structure of FIG. 6 where the exposed dielectric liner is selectively removed, in accordance with an embodiment of the present invention.

FIG. 7 is a cross-sectional view of the semiconductor structure of FIG. 6 where the exposed dielectric liner is selectively removed, in accordance with an embodiment of the present invention.

In various example embodiments, the exposed dielectric liner is selectively removed. As a result, sidewalls of the spacers 34 and the inner spacers 36 are exposed. Dielectric liner portions 44B remains visible, which are vertically aligned with the inner spacers 36. The remaining dielectric liner can be referred to as dielectric liner sections 44' in the X1-cut direction. In the Y2-cut direction, the remaining dielectric liner can be referred to as dielectric liner sections 44". Top portions of the dielectric liner sections 44" can be designated as 44C.

Figure 8:
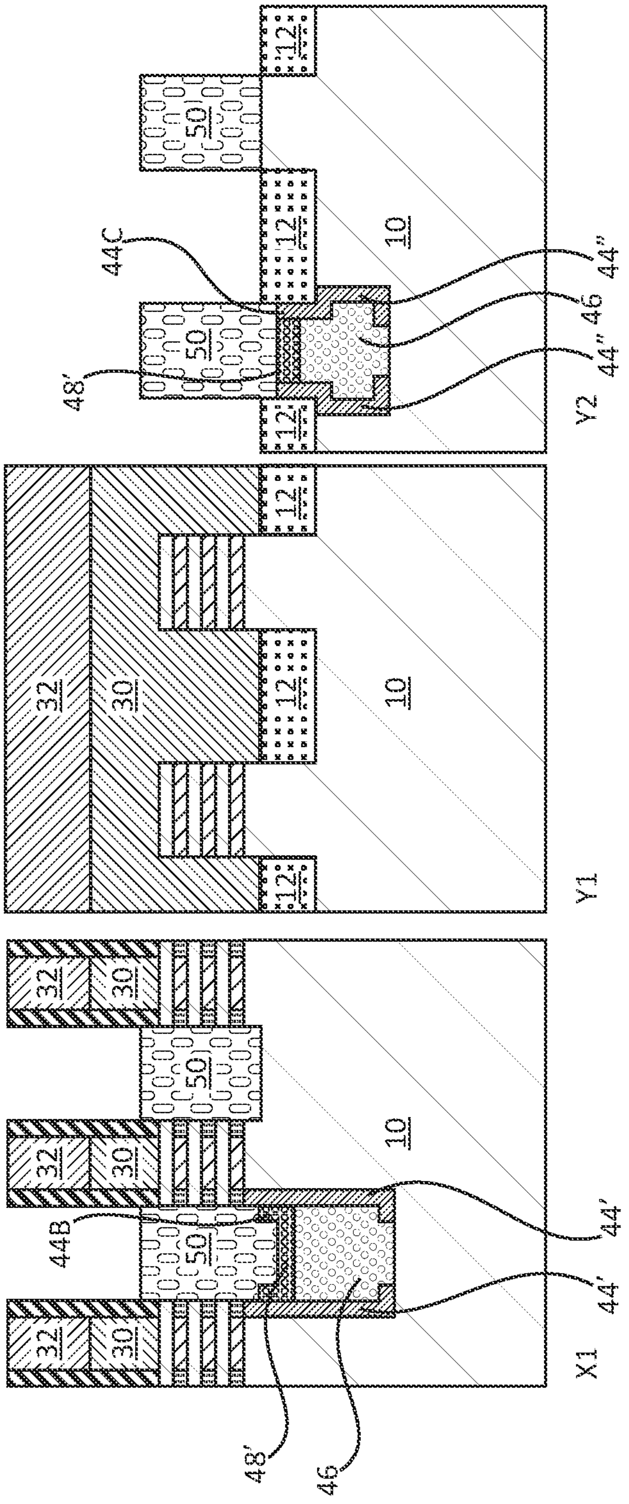
FIG. 8 is a cross-sectional view of the semiconductor structure of FIG. 7 where source/drain (S/D) epi regions are formed over at least the Si cap layer portions, in accordance with an embodiment of the present invention.

FIG. 8 is a cross-sectional view of the semiconductor structure of FIG. 7 where source/drain (S/D) epi regions are formed over at least the Si cap layer portions, in accordance with an embodiment of the present invention.

In various example embodiments, source/drain (S/D) epi regions 50 are formed over at least the Si cap layer portions 48'.

In the X1-cut direction, the S/D epi regions 50 directly contact the top surface of the Si cap layer portion 48' and the dielectric liner portions 44B. The S/D epi regions 50 directly contact sidewalls of all the inner spacers 36.

In the Y2-cut direction, the S/D epi region 50 directly contacts the top surface of the Si cap layer portion 48' and the top portions 44C of the dielectric liner sections 44".

S/D epi regions 50 can be of the same or different materials for pFET and nFET devices, and can be either in-situ doped with appropriate polarity dopants (B for pFET and P for nFET devices) or doped by ion implantation.

The terms "epitaxial growth" and "epitaxial deposition" refer to the growth of a semiconductor material on a deposition surface of a semiconductor material, in which the semiconductor material being grown has substantially the same crystalline characteristics as the semiconductor material of the deposition surface. The term "epitaxial material" denotes a material that is formed using epitaxial growth. In some embodiments, when the chemical reactants are controlled and the system parameters set correctly, the depositing atoms arrive at the deposition surface with sufficient energy to move around on the surface and orient themselves to the crystal arrangement of the atoms of the deposition surface. Thus, in some examples, an epitaxial film deposited on a {100} crystal surface will take on a {100} orientation.

Figure 9:
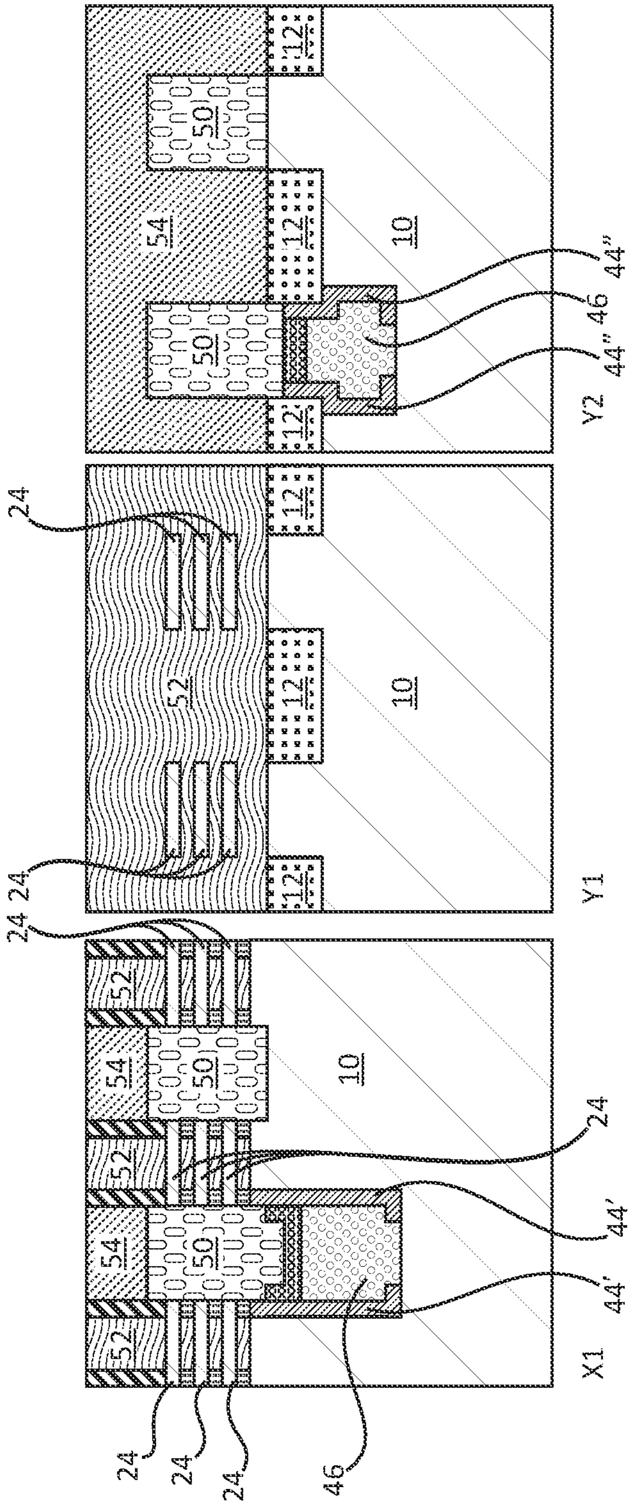
FIG. 9 is a cross-sectional view of the semiconductor structure of FIG. 8 where the sacrificial layer with the hardmask and the sacrificial layers of the nanosheet stacks are selectively removed and replaced with a replacement metal gate (RMG), in accordance with an embodiment of the present invention.

FIG. 9 is a cross-sectional view of the semiconductor structure of FIG. 8 where the sacrificial layer with the hardmask and the sacrificial layers of the nanosheet stacks are selectively removed and replaced with a replacement metal gate (RMG), in accordance with an embodiment of the present invention.

In various example embodiments, the sacrificial layer 30 with the hardmask 32 and the sacrificial layers 22 of the nanosheet stacks 20 are selectively removed and replaced with a replacement metal gate (RMG) 52 or high-k metal gate (HKMG). An interlayer dielectric (ILD) 54 is also deposited over the S/D epi regions 50.

The HKMG material of the replacement metal gates 52 can be deposited by any suitable techniques, such as ALD, CVD, metal-organic CVD (MOCVD), physical vapor deposition (PVD), thermal oxidation, combinations thereof, or other suitable techniques. The gate dielectric material of the replacement metal gates 52 can include, e.g., LaO, AlO, ZrO, TiO, $Ta_2O_5$, $Y_2O_3$, $SrTiO_3$(STO), $BaTiO_3$(BTO), BaZrO, HfZrO, HfLaO, HfSiO, LaSiO, AlSiO, HfTaO, HfTiO, (Ba,Sr)$TiO_3$(BST), $Al_2O_3$, $Si_3N_4$, oxynitrides (SiON), or other suitable materials. The HKMG of the RMG gate 52 further comprises work function metals, such as TiN, TiAl, TiC, TiAlC, etc., and conductive metal fills, such as W, Al, Ru, etc.

The ILD 54 can be any suitable material, such as, for example, porous silicates, carbon doped oxides, silicon dioxides, silicon nitrides, silicon oxynitrides, or other dielectric materials. Any known manner of forming the ILD 54 can be utilized. The ILD 54 can be formed using, for example, CVD, PECVD, ALD, flowable CVD, spin-on dielectrics, or PVD.

Figure 10:
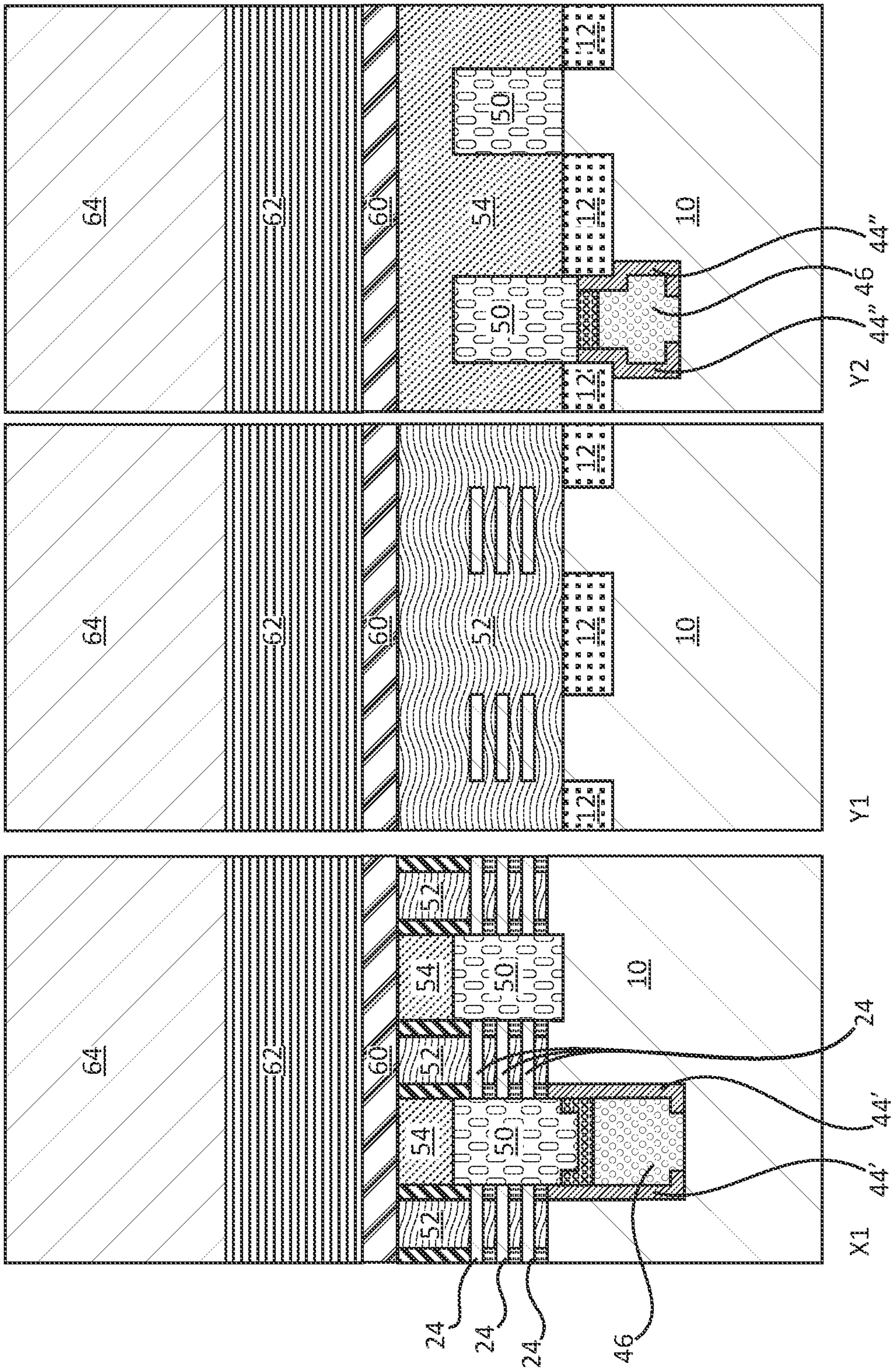
FIG. 10 is a cross-sectional view of the semiconductor structure of FIG. 9 where back-end-of-line (BEOL) processing takes place and a carrier wafer is bonded to the BEOL, in accordance with an embodiment of the present invention.

FIG. 10 is a cross-sectional view of the semiconductor structure of FIG. 9 where back-end-of-line (BEOL) processing takes place and a carrier wafer is bonded to the BEOL, in accordance with an embodiment of the present invention.

In various example embodiments, a hardmask layer 60 is deposited and back-end-of-line (BEOL) processing 62 takes place and a carrier wafer 64 is bonded to the BEOL 62.

In various embodiments, the hardmask layer 60 can be a nitride, for example, a silicon nitride (SiN), an oxynitride, for example, silicon oxynitride (SiON), or a combination thereof.

Figure 11:
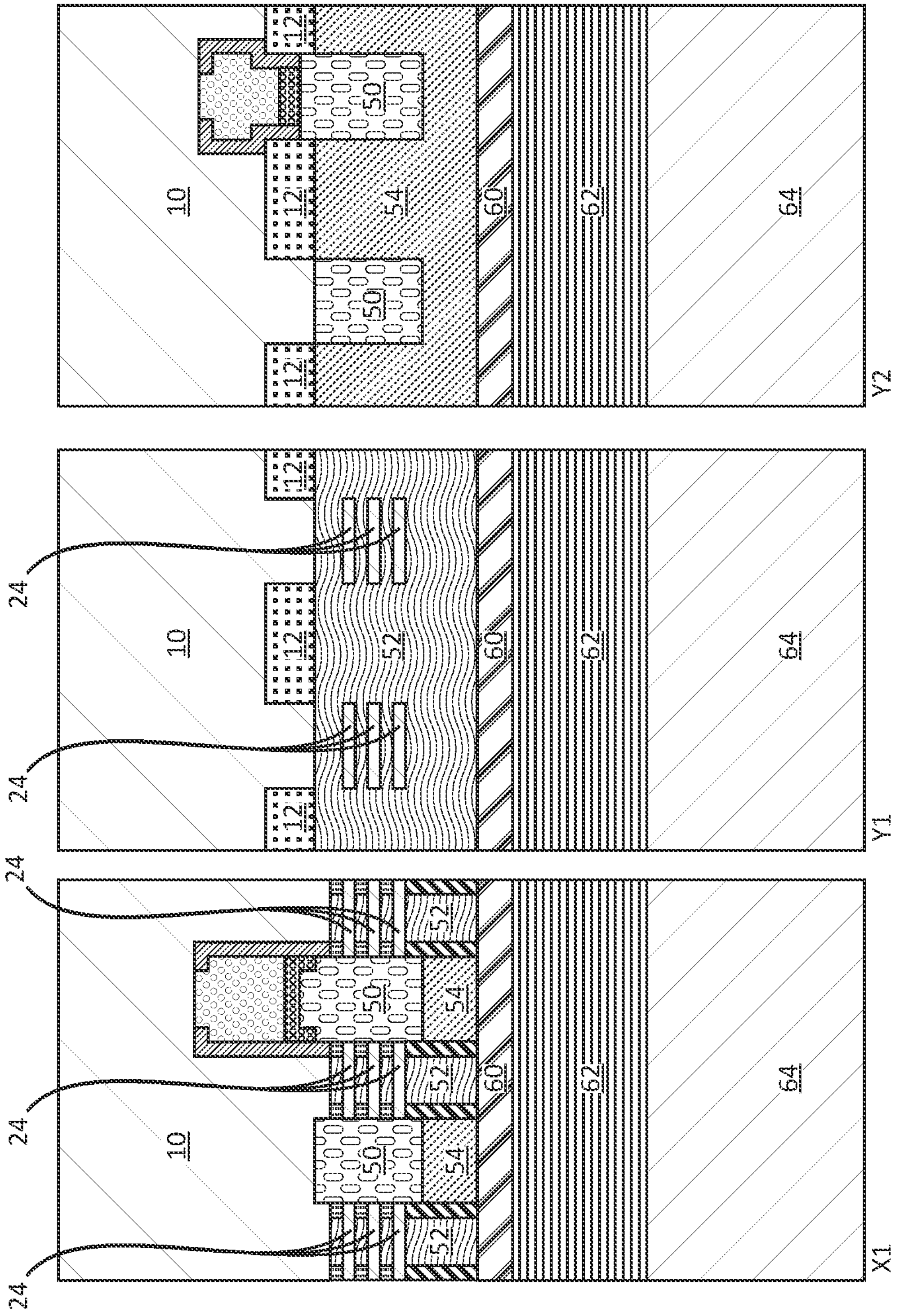
FIG. 11 is a cross-sectional view of the semiconductor structure of FIG. 10 where the structure is flipped and the substrate is thinned down, in accordance with an embodiment of the present invention.

FIG. 11 is a cross-sectional view of the semiconductor structure of FIG. 10 where the structure is flipped and the substrate is thinned down, in accordance with an embodiment of the present invention.

In various example embodiments, the structure is flipped and the substrate 10 is thinned down.

Figure 12:
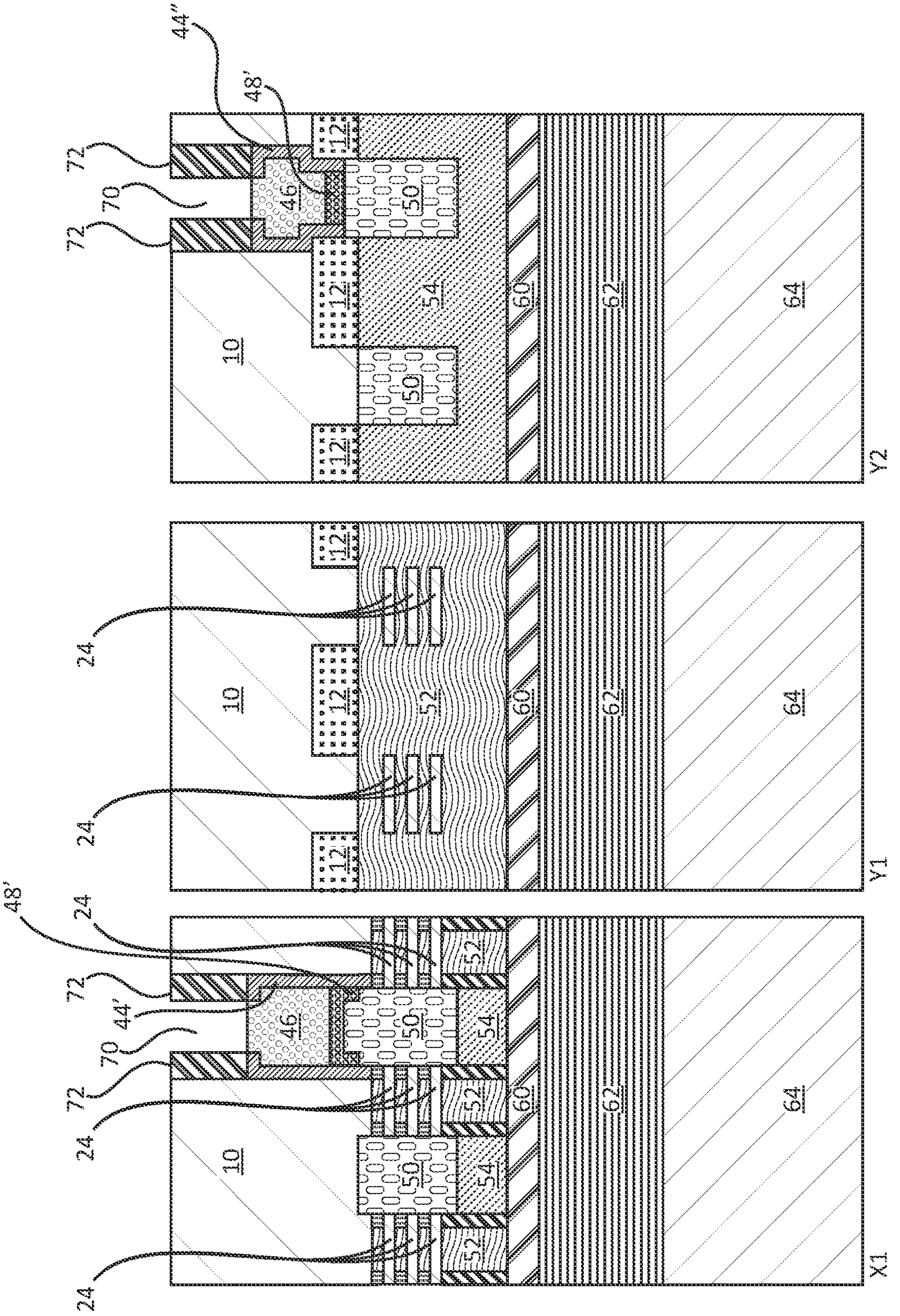
FIG. 12 is a cross-sectional view of the semiconductor structure of FIG. 11 where vias are formed over the SiGe layer with the low Ge concentration and spacers are formed over the remaining dielectric liner, in accordance with an embodiment of the present invention.

FIG. 12 is a cross-sectional view of the semiconductor structure of FIG. 11 where vias are formed over the SiGe layer with the low Ge concentration and spacers are formed over the remaining dielectric liner, in accordance with an embodiment of the present invention.

In various example embodiments, vias 70 are advantageously formed over the SiGe layer 46 with the low Ge concentration and via spacers 72 are advantageously formed over the remaining dielectric liner 44', Vias 70 expose the entire upper surface of the SiGe layer 46. Vias 70 also expose a partial surface of the remaining dielectric liner 44' (X1-cut) and expose a partial surface of the dielectric liner sections 44" (Y2-cut). The via spacers 72 are advantageously thicker than the remaining dielectric liner 44' and the dielectric liner sections 44". The via spacers 72 are advantageously vertically aligned with the remaining dielectric liner 44' and the dielectric liner sections 44".

Figure 13:
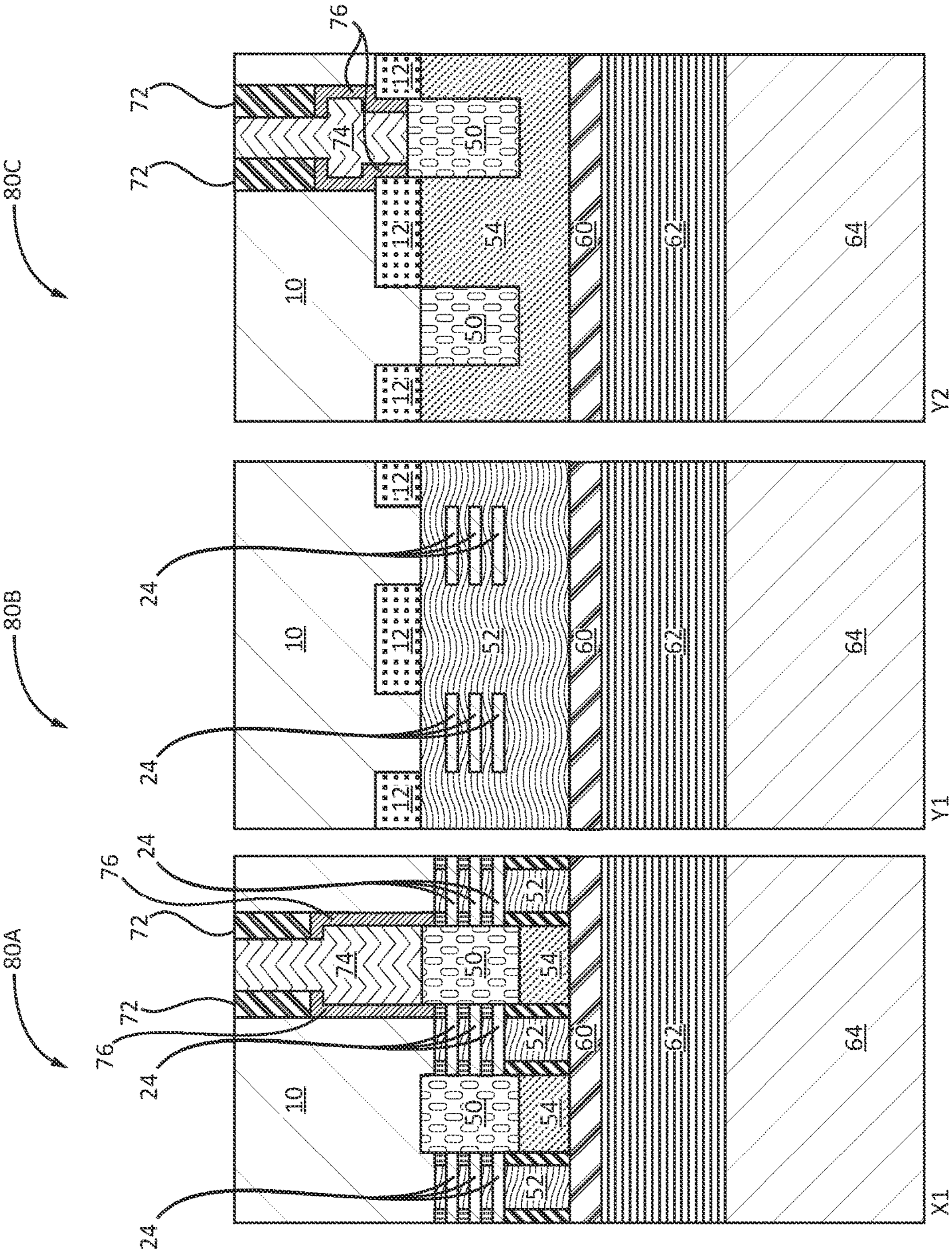
FIG. 13 is a cross-sectional view of the semiconductor structure of FIG. 12 where the SiGe layer with the low Ge concentration is removed and a metal fill takes place, in accordance with an embodiment of the present invention.

FIG. 13 is a cross-sectional view of the semiconductor structure of FIG. 12 where the SiGe layer with the low Ge concentration is removed and a metal fill takes place, in accordance with an embodiment of the present invention.

In various example embodiments, the SiGe layer 46 with the low Ge concentration is removed and a metal fill takes place with a conductive material 74. The removal of the SiGe layer 46 results in partial removal of sections of the remaining dielectric liner 44' (X1-cut) and the dielectric liner sections 44" (Y2-cut). This results in final dielectric liners 76. The conductive material 74 can be referred to as a backside contact 74.

The backside contact 74 directly contacts the top surface of the S/D epi regions 50. The backside contact 74 directly contacts the sidewalls of the via spacers 72 and the final dielectric liners 76. In the Y2-cut, a portion of the final dielectric liners 76 can advantageously have a substantially or generally C-shaped and/or inverted C-shaped configuration. In the Y2-cut, the final dielectric liners 76 directly contact a top surface of the S/D epi regions 50, whereas in the X1-cut, the final dielectric liners 76 directly contact an upper sidewall of the S/D epi regions 50. The final dielectric liners 76 advantageously prevent sub-nanosheet leakage current.

Structure 80A (X1-cut) and structure 80C (Y2-cut) clearly illustrate the backside contact 74 within the via spacers 72 and the final dielectric liners 76. Structure 80B (Y1-cut) illustrates the replacement metal gates 52 surrounding the Si layers 24 of the nanosheets stacks 20.

Therefore, the backside contact 74 of the nanosheet transistor is positioned on a silicon (Si) layer 10 of a wafer and a dielectric liner 76 is advantageously disposed between the backside contact 74 and the Si layer 10 such that the dielectric liner 76 is advantageously located below via spacers 72 of the nanosheet transistor. The backside contact 74 is advantageously closer to a backside of the wafer than a frontside of the wafer. The backside contact 74 directly contacts a top surface of the S/D epi region 50. The dielectric liner 76 directly contacts the S/D epi region 50. The dielectric liner 76 is advantageously vertically aligned with the via spacers 72. The dielectric liner 76 is also advantageously vertically aligned with the inner spacers 36 of a nanosheet stack of the nanosheet transistor. The dielectric liner 76 is advantageously thinner than the gate spacers 73. Moreover, the via spacers 72 and the dielectric liner 76 collectively encompass the backside contact 74. In other words, the backside contact 74 is advantageously confined within the boundaries defined by the via spacers 72 and the dielectric liner 76. Also, a bottom surface of the via spacers 72 directly contacts a top surface of the dielectric liner 76 such that no BDI layer is located below the nanosheet stack. This advantageously result in the formation of a self-aligned backside contact without a BDI layer.

Non-limiting examples of suitable conductive materials for the backside contact 74 include a silicide liner such as Ti, Ni, NiPt, etc., an adhesion metal liner, such as TiN, TaN, and conductive metal fill, such as Al, W, Co, Ru, etc. The conductive material can further include dopants that are incorporated during or after deposition. The conductive metal can be deposited by a suitable deposition process, for example, CVD, PECVD, PVD, plating, thermal or e-beam evaporation, and sputtering.

In conclusion, the exemplary embodiments of the present invention present a self-aligned backside contact in a nanosheet structure without a bottom dielectric isolation (BDI) layer. A dielectric liner is advantageously disposed between the backside contact and a Si layer such that the dielectric liner is advantageously located below gate spacers of the nanosheet transistor. This dielectric liner eliminates the need for a BDI layer and advantageously prevents sub-nanosheet leakage current.

Regarding FIGS. 1-13, deposition is any process that grows, coats, or otherwise transfers a material onto the wafer. Available technologies include, but are not limited to, thermal oxidation, physical vapor deposition (PVD), chemical vapor deposition (CVD), electrochemical deposition (ECD), molecular beam epitaxy (MBE) and more recently, atomic layer deposition (ALD) among others. As used herein, "depositing" can include any now known or later developed techniques appropriate for the material to be deposited including but not limited to, for example: chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metal-organic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation.

The term "processing" as used herein includes deposition of material or photoresist, patterning, exposure, development, etching, cleaning, stripping, implanting, doping, stressing, layering, and/or removal of the material or photoresist as needed in forming a described structure.

Removal is any process that removes material from the wafer: examples include etch processes (either wet or dry), and chemical-mechanical planarization (CMP), etc.

Patterning is the shaping or altering of deposited materials, and is generally referred to as lithography. For example, in conventional lithography, the wafer is coated with a chemical called a photoresist; then, a machine called a stepper focuses, aligns, and moves a mask, exposing select portions of the wafer below to short wavelength light; the exposed regions are washed away by a developer solution. After etching or other processing, the remaining photoresist is removed. Patterning also includes electron-beam lithography.

It is to be understood that the present invention will be described in terms of a given illustrative architecture; however, other architectures, structures, substrate materials and process features and steps/blocks can be varied within the scope of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical mechanisms (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which usually include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present embodiments. The compounds with additional elements will be referred to herein as alloys.

Reference in the specification to "one embodiment" or "an embodiment" of the present invention, as well as other variations thereof, means that a particular feature, structure, characteristic, and so forth described in connection with the embodiment is included in at least one embodiment of the present invention. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Having described preferred embodiments of methods and structures providing for constructing a self-aligned backside contact in a nanosheet structure without a bottom dielectric isolation (BDI) layer (which are intended to be illustrative and not limiting), it is noted that modifications and variations can be made by persons skilled in the art in light of the above teachings. It is therefore to be understood that changes may be made in the particular embodiments described which are within the scope of the invention as outlined by the appended claims. Having thus described aspects of the invention, with the details and particularity required by the patent laws, what is claimed and desired protected by Letters Patent is set forth in the appended claims.

The invention claimed is:

1. A semiconductor structure comprising:

a backside contact of a nanosheet transistor positioned on a silicon (Si) layer of a wafer; and a dielectric liner disposed between the backside contact and the Si layer such that the dielectric liner is located below via spacers of the nanosheet transistor.

2. The semiconductor structure of claim 1, wherein the backside contact is closer to a backside of the wafer than a frontside of the wafer.

3. The semiconductor structure of claim 1, wherein the backside contact directly contacts a top surface of a source/drain (S/D) epi region.

4. The semiconductor structure of claim 3, wherein the dielectric liner directly contacts the S/D epi region.

5. The semiconductor structure of claim 1, wherein the dielectric liner has a generally L-shaped configuration.

6. The semiconductor structure of claim 1, wherein the dielectric liner is vertically aligned with the via spacers.

7. The semiconductor structure of claim 1, wherein the dielectric liner is vertically aligned with inner spacers of a nano sheet stack of the nanosheet transistor.

8. The semiconductor structure of claim 1, wherein the dielectric liner is thinner than the via spacers.

9. The semiconductor structure of claim 1, wherein the via spacers and the dielectric liner collectively encompass the backside contact.

10. A semiconductor structure comprising:

a backside contact of a nanosheet transistor extending to a top surface of a source/drain (S/D) epi region; and a dielectric liner disposed directly between the backside contact and a silicon (Si) layer of a wafer and in direct contact with the backside contact.

11. The semiconductor structure of claim 10, wherein the dielectric liner is located below via spacers of the nanosheet transistor.

12. The semiconductor structure of claim 11, wherein the dielectric liner is vertically aligned with the via spacers.

13. The semiconductor structure of claim 11, wherein the dielectric liner is thinner than the via spacers.

14. The semiconductor structure of claim 10, wherein the backside contact is located on the Si layer.

15. The semiconductor structure of claim 13, wherein the backside contact is closer to a backside of the wafer than a frontside of the wafer.

16. The semiconductor structure of claim 10, wherein the dielectric liner has a generally L-shaped configuration.

17. The semiconductor structure of claim 10, wherein the dielectric liner is vertically aligned with inner spacers of a nanosheet stack of the nanosheet transistor.

18. A method comprising:

positioning a backside contact of a nanosheet transistor on a silicon (Si) layer of a wafer; and disposing a dielectric liner between the backside contact and the Si layer such that the dielectric liner is located below via spacers of the nanosheet transistor.

19. The method of claim 18, wherein the backside contact is closer to a backside of the wafer than a frontside of the wafer.

20. The method of claim 18, wherein the dielectric liner is vertically aligned with the via spacers.

* * * * *